US010991769B2

(12) United States Patent
Lee et al.

(10) Patent No.: US 10,991,769 B2
(45) Date of Patent: Apr. 27, 2021

(54) DISPLAY APPARATUS HAVING A COLOR FILTER LAYER

(71) Applicant: Samsung Display Co., Ltd., Yongin-si (KR)

(72) Inventors: Hyeonbum Lee, Hwaseong-si (KR); Dongki Lee, Seongnam-si (KR); Eonjoo Lee, Hwaseong-si (KR); Jin-Whan Jung, Chungcheongnam-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/536,975

(22) Filed: Aug. 9, 2019

(65) Prior Publication Data
US 2020/0135810 A1    Apr. 30, 2020

(30) Foreign Application Priority Data

Oct. 31, 2018   (KR) .......................... 10-2018-0132289

(51) Int. Cl.
*H01L 27/32*     (2006.01)
*H01L 51/52*     (2006.01)

(52) U.S. Cl.
CPC ........ *H01L 27/322* (2013.01); *H01L 27/3211* (2013.01); *H01L 27/3272* (2013.01); *H01L 51/5237* (2013.01)

(58) Field of Classification Search
None
See application file for complete search history.

(56) References Cited

U.S. PATENT DOCUMENTS

| 9,818,973 | B2 | 11/2017 | Lee et al. | |
| 9,921,414 | B2 | 3/2018 | Kwon et al. | |
| 2018/0123074 | A1* | 5/2018 | Lee | H01L 27/322 |
| 2018/0182816 | A1* | 6/2018 | Kang | H01L 27/323 |
| 2018/0182819 | A1* | 6/2018 | Jo | H01L 27/323 |

FOREIGN PATENT DOCUMENTS

| KR | 10-2012-0133955 | 12/2012 |
| KR | 10-2016-0148102 | 12/2016 |
| KR | 10-2017-0000030 | 1/2017 |
| KR | 10-2018-0074944 | 7/2018 |

* cited by examiner

*Primary Examiner* — Dung A. Le
(74) *Attorney, Agent, or Firm* — F. Chau & Associates, LLC

(57) ABSTRACT

A display that includes a base layer having an emission area and a non-emission area adjacent to the emission area. A circuit element layer is disposed on the base layer. A display element layer is disposed on the circuit element layer. The display element layer includes an organic light emitting diode. An encapsulation layer is disposed on the display element layer and is configured to encapsulate the organic light emitting diode. A color filter layer is disposed in the encapsulation layer. The color filter layer includes a color shielding layer having a plurality of layers disposed in the non-emission area and a color filter disposed in the emission area.

20 Claims, 17 Drawing Sheets

DISPLAY APPARATUS HAVING A COLOR FILTER LAYER

CROSS-REFERENCE TO RELATED APPLICATION

This application claims priority under 35 U.S.C. § 119 to Korean Patent Application No. 10-2018-0132289, filed on Oct. 31, 2018 in the Korean Intellectual Property Office (KIPO), the disclosure of which is incorporated by reference in its entirety herein.

TECHNICAL FIELD

The present disclosure herein relates to a display apparatus and a manufacturing method thereof, and more particularly, to an organic light emitting display apparatus and a manufacturing method thereof.

DISCUSSION OF RELATED ART

Various display devices that are used in multi-media devices such as televisions, mobile phones, tablet computers, Global Positioning Systems, and video game devices have been developed. The display device may include various display panels such as a liquid crystal display panel or an organic light emitting display panel.

Typically, an organic light emitting display panel may include a polarization film to prevent reflection of external light. However, the polarization film has low transmittance, and thus has a low optical characteristic efficiency, which result in degradation of the image quality.

SUMMARY

The present disclosure herein relates to a display apparatus capable of securing a low external light reflection ratio without using a polarization film, and a manufacturing method thereof.

In an exemplary embodiment of the present inventive concepts, a display includes a base layer having an emission area and a non-emission area adjacent to the emission area. A circuit element layer is disposed on the base layer. A display element layer is disposed on the circuit element layer. The display element layer includes an organic light emitting diode. An encapsulation layer is disposed on the display element layer and is configured to encapsulate the organic light emitting diode. A color filter layer is disposed in the encapsulation layer. The color filter layer includes a color shielding layer having a plurality of layers disposed in the non-emission area and a color filter disposed in the emission area.

In another exemplary embodiment of the present inventive concepts, a display apparatus includes a base layer comprising an emission area and a non-emission area adjacent to the emission area. A circuit element layer is disposed on the base layer. A display element layer is disposed on the circuit element layer. The display element layer includes an organic light emitting diode. An encapsulation layer is disposed on the display element layer and is configured to encapsulate the organic light emitting diode. A color filter layer is disposed between the display element layer and the encapsulation layer. The color filter layer includes a color shielding layer having at least two layers disposed in the non-emission area and a color filter disposed in the emission area.

In another exemplary embodiment of the present inventive concepts, a display apparatus includes a base layer comprising an emission area and a non-emission area adjacent to the emission area. A circuit element layer is disposed on the base layer. A display element layer is disposed on the circuit element layer and includes an organic light emitting diode disposed in the emission area. An encapsulation layer is disposed on the display element layer and is configured to encapsulate the organic light emitting diode. A color filter layer is disposed in the encapsulation layer. The color filter layer includes: a color shielding layer having a plurality of layers disposed in the non-emission area; a color filter disposed in the emission area; and an auxiliary shielding layer disposed in the non-emission area and configured to cover the color shielding layer.

An exemplary embodiment of the present inventive concepts provides a display apparatus including a base layer, a circuit element layer, a display element layer, an encapsulation layer, and a color filter layer.

In an exemplary embodiment, an emission area and a non-emission area adjacent to the emission area may be defined on the base layer.

In an exemplary embodiment, the circuit element layer may be disposed on the base layer.

In an exemplary embodiment, the display element layer may be disposed on the circuit element layer and include an organic light emitting diode in the emission area.

In an exemplary embodiment, the encapsulation layer may be disposed on the display element layer and configured to encapsulate the organic light emitting diode.

In an exemplary embodiment, the color filter layer may be disposed in a lower part of an upper surface of the encapsulation layer.

In an exemplary embodiment, the color filter layer may include a color shielding layer including at least two layers disposed on the non-emission area and having different colors, and a color filter disposed in the emission area.

In an exemplary embodiment, the color shielding layer may include a first to third color shielding layers.

In an exemplary embodiment, the first color shielding layer may have a first color. The second color shielding layer may be disposed on the first color shielding layer and have a second color that is different from the first color. The third color shielding layer may be disposed on the second color shielding layer and have a third color that is different from the first and second colors. The color filter may have a color identical to any one of the first to third colors.

In an exemplary embodiment, the first color may be green, the second color may be red, and the third color may be blue.

In an exemplary embodiment, the color filter may have an identical material to any one of the first to third color shielding layers.

In an exemplary embodiment, the color filter layer may further include an auxiliary shielding layer disposed in the non-emission area and disposed on the third color shielding layer.

In an exemplary embodiment, the auxiliary shielding layer may cover side surfaces of the first to third color shielding layers.

In an exemplary embodiment, the auxiliary shielding layer may include a metal oxide or a metal alloy oxide.

In an exemplary embodiment, the auxiliary shielding layer may include at least one of $CuO$, $CrO$, $FeO$, $Ni_2O_3$, and $MoTaO_x$.

In an exemplary embodiment of the present inventive concepts, the encapsulation layer includes a first encapsulation inorganic layer, a first encapsulation organic layer, and a second encapsulation inorganic layer. The first encapsulation inorganic layer may be disposed on the display element layer. The first encapsulation organic layer may be disposed on the first encapsulation inorganic layer. The second encapsulation inorganic layer may be disposed on the first encapsulation organic layer. The color filter layer may be disposed between the first encapsulation inorganic layer and the first encapsulation organic layer.

In an exemplary embodiment, the color filter may contact the first encapsulation organic layer.

In an exemplary embodiment, the color filter layer may be disposed between the display element layer and the encapsulation layer.

In an exemplary embodiment, the display element layer may further include an emission area definition layer. The color shielding layer may overlap the emission area definition layer.

In an exemplary embodiment of the present inventive concepts, a display apparatus includes a base layer, a circuit element layer, a display element layer, an encapsulation layer, and a color filter layer.

In an exemplary embodiment, an emission area and a non-emission area adjacent to the emission area may be defined on the base layer.

In an exemplary embodiment, the circuit element layer may be disposed on the base layer.

In an exemplary embodiment, the display element layer may be disposed on the circuit element layer and include an organic light emitting diode disposed in the emission area.

In an exemplary embodiment, the encapsulation layer may be disposed on the display element layer and encapsulate the organic light emitting diode.

In an exemplary embodiment, the color filter layer may be disposed in the encapsulation layer.

In an exemplary embodiment, the color filter layer may include a color shielding layer, a color filter, and an auxiliary shielding layer.

In an exemplary embodiment, the color shielding layer may include at least two layers disposed in the non-emission area and having different colors. The color filter may be disposed in the emission area. The auxiliary shielding layer may be disposed in the non-emission area and cover the color shielding layer.

BRIEF DESCRIPTION OF THE FIGURES

The accompanying drawings are included to provide a further understanding of the present inventive concepts, and are incorporated in and constitute a part of this specification. The drawings illustrate exemplary embodiments of the present inventive concepts and, together with the description, serve to explain principles of the inventive concepts. In the drawings.

DETAILED DESCRIPTION OF THE EXEMPLARY EMBODIMENTS

Figure 1:
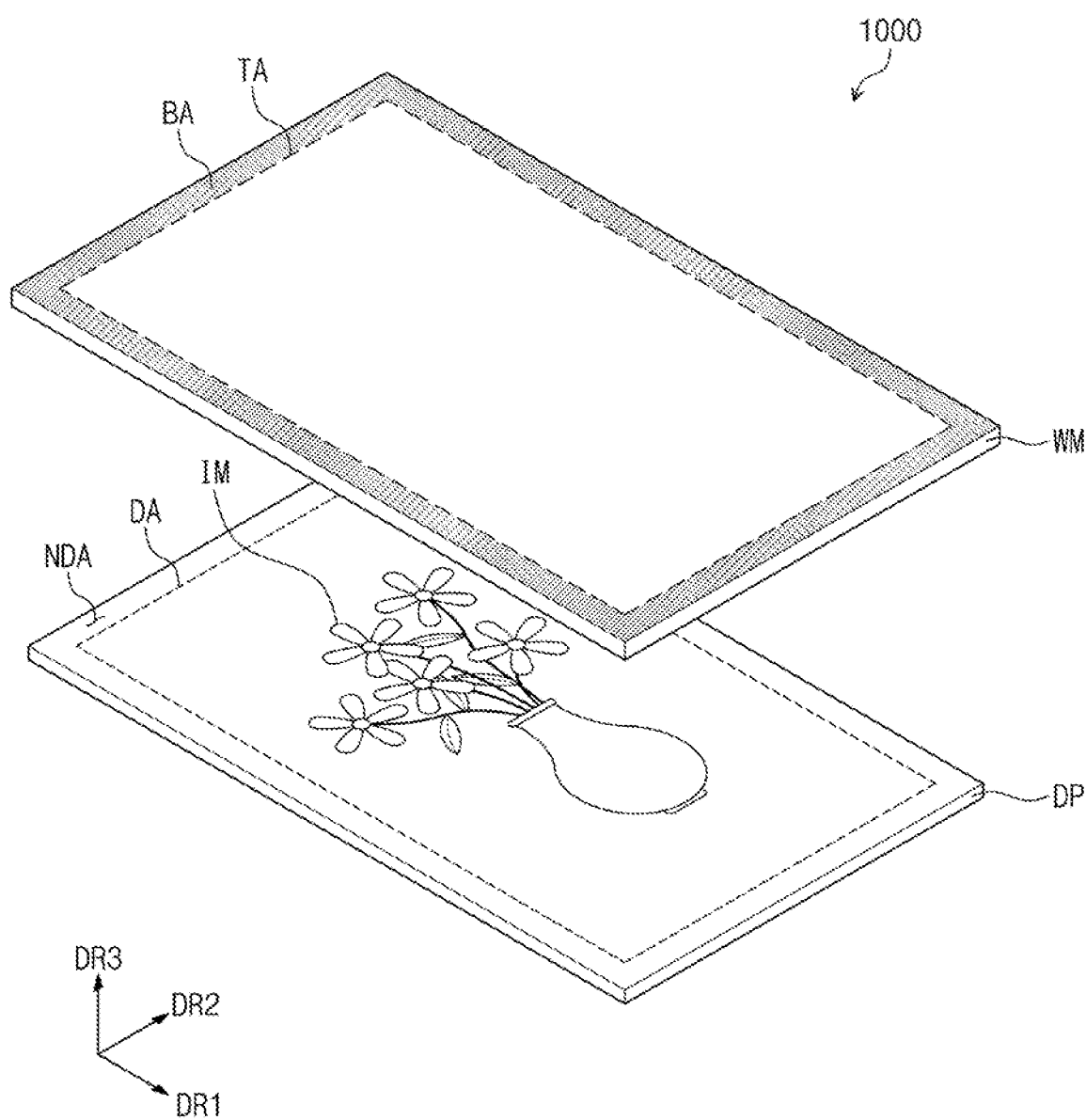
FIG. 1 is a perspective view of a display apparatus according to an exemplary embodiment of the present inventive concepts.

Hereinafter, exemplary embodiments of the present inventive concepts will be described with reference to the accompanying drawings. It will be understood that when an element or layer is referred to as being "on", "connected to" or "coupled to" another element or layer, it can be directly on, connected or coupled to the other element or layer or intervening elements or layers may be present.

Like reference numerals in the drawings refer to like elements. In addition, in the drawings, the thickness and the ratio and the dimension of the element are exaggerated for effective description of the technical contents. The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present invention. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Figure 2:
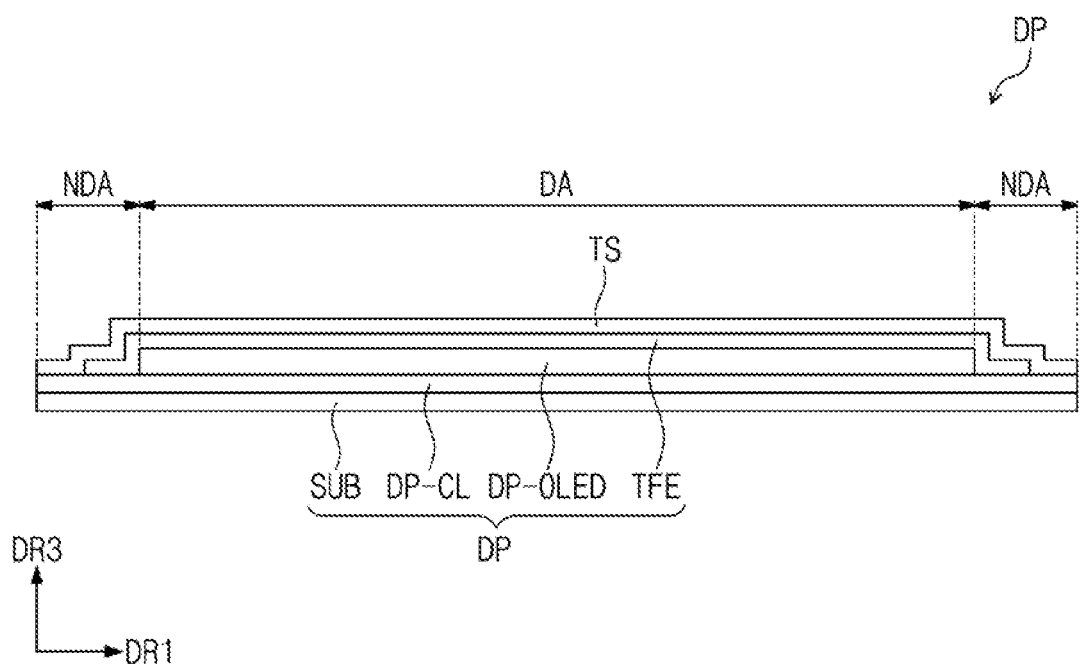
FIG. 2 is a cross-sectional view of a display apparatus of FIG. 1 according to an exemplary embodiment of the present inventive concepts.

FIG. 1 is a perspective view of a display apparatus 1000 according to an exemplary embodiment of the present inventive concepts, and FIG. 2 is a cross-sectional view of the display apparatus of FIG. 1 according to an exemplary embodiment of the present inventive concepts.

The display apparatus 1000 according to an exemplary embodiment of the present inventive concepts may be applied not only to a large electronic device such as a television or a monitor, but also to small and medium electronic devices such as smartphones, tablets, Global Positioning Systems, video game devices or smart watches.

In relation to FIG. 1, the display apparatus 1000 may include a display panel DP and a window member WM.

A display surface on which an image IM is displayed in the display panel DP may be parallel to a surface defined by a first directional axis DR1 and a second directional axis DR2. The thickness direction of the display panel DP may indicate a third directional axis DR3 which is generally perpendicular to the first directional axis DR1 and the second directional axis DR2. A front surface (or an upper surface) and a rear surface (or a lower surface) of each member may be distinguished by the third directional axis DR3. However, directions indicated by the first to third directional axes DR1, DR2, and DR3 are a relative concept and may be changed to other directions. Hereinafter, the first to third directions are directions respectively indicated by the first to third directional axes DR1, DR2, and DR3 and refer to the same reference numerals.

The display panel DP may be a flexible display panel or a rigid display panel.

As illustrated in FIG. 1, the display panel DP may include a display area DA on which the image IM is displayed and a non-display area NDA adjacent to the display area DA. The non-display area NDA may be an area on which the image is not displayed. In FIG. 1, a vase filled with flowers is illustrated as an example of the image IM. In an exemplary embodiment, the display area DA may have a rectangular shape. The non-display area NDA may surround the display area DA. However, exemplary embodiments of the present inventive concepts are not limited thereto, and the shape of the display area DA and the shape of the non-display area NDA may be designed with various shapes and relationships to each other.

The window member WM may be disposed on the display panel DP. The window member WM protects the display panel DP from damage due to external forces, such as scratches. The window member WM may define the appearance of the display apparatus 1000.

The window member WM may be divided into a transmission area TA and a non-transmission area BA. The transmission area TA may have optical transparency. Accordingly, the transmission area TA may transmit a majority of the input light. For example, the transmission area TA may have optical transmittance of about 90% or more. The transmission area TA of the window member WM may correspond to the display area DA of the display panel DP.

The non-transmission area BA may block most of the input light. The non-transmission area BA may prevent components disposed in a lower part of the window member WM from being visually recognized from the outside. In addition, the non-transmission area BA may reduce the reflection of light incident from the outside of the window member WM. The non-transmission area BA may overlap the non-display area NDA of the display panel DP.

The non-transmission area BA may be adjacent to the transmission area TA. The shape of the transmission area TA on a plane may be defined by the non-transmission area BA.

FIG. 2 is a cross-sectional view of the display panel DP according to an exemplary embodiment of the present inventive concepts taken along a cross section defined by the first directional axis DR1 and the third directional axis DR3.

The display panel DP may be a light emitting type display panel, but the display panel is not particularly limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, exemplary embodiments of the present inventive concepts will be described with the display panel DP as an organic light emitting display panel.

The display panel DP may include a base layer SUB, a circuit element layer DP-CL disposed on the base layer SUB, a display element layer DP-OLED and an encapsulation layer TFE. In some embodiments, the display panel DP may further include functional layers such as a refractive index adjustment layer.

The base layer SUB may include at least one plastic film. The base layer SUB may include, as a flexible substrate, a plastic substrate, a glass substrate, a metal substrate, an organic/inorganic composite material substrate, etc. The display area DA and the non-display area NDA of the base layer SUB may be defined identically as previously described in relation to FIG. 1.

The circuit element layer DP-CL may include at least one intermediate insulation layer and a circuit element. The intermediate insulation layer may include at least one intermediate inorganic film and at least one intermediate organic film. The circuit element may include signal lines and a driving circuit of a pixel, etc.

The display element layer DP-OLED may include organic light emitting diodes. The display element layer DP-OLED may further include an organic film such as a light emitting area definition layer.

The encapsulation layer TFE may encapsulate the display element layer DP-OLED. The encapsulation layer TFE may include at least one inorganic film (hereinafter, an encapsulation inorganic film). The encapsulation layer TFE may further include at least one organic film (hereinafter, an encapsulation organic film). The encapsulation inorganic film protects the display element layer DP-OLED from moisture/oxygen, and the encapsulation organic film protects the display element layer DP-OLED from a foreign material such as a dust particle. The encapsulation inorganic film may include a silicon nitride layer, a silicon oxynitride layer, and a silicon oxide layer, a titanium oxide layer, or an aluminum oxide layer, etc. The encapsulation organic film may include an acrylic-based organic layer, but exemplary embodiments are not limited thereto.

The display panel DP may further include a touch sensing unit TS (or a touch sensing layer) and a color filter layer. The display panel according to an exemplary embodiment of the present inventive concepts may further include a protection member disposed on the lower surface of the base layer SUB.

The touch sensing unit TS may acquire coordinate information on an external input. The touch sensing unit TS may be directly disposed on the encapsulation layer TFE. However, exemplary embodiments of the present inventive concepts are not limited thereto, and the touch sensing unit TS may be attached using an adhesive layer on the encapsulation layer TFE.

The touch sensing unit TS may have a multi-layer structure. The touch sensing unit TS may include a conductive layer of a single layer or multiple layers. The touch sensing unit TS may include an insulation layer of a single layer or multiple layers.

The touch sensing unit TS may sense an external input. For example, the touch sensing unit TS may sense an external input in a capacitive manner. However, the operation manner of the touch sensing unit TS in exemplary embodiments of the present inventive concepts is not particularly limited, and the touch sensing unit TS in the exemplary embodiments of the present inventive concepts may also sense an external input in a electromagnetic inductive manner or a pressure sensing manner.

The color filter layer may permit the transmission of light generated in the display element layer DP-OLED. The color filter layer may also reduce a reflection ratio of external light. In addition, external light passing the color filter layer may be absorbed and the color filter layer may reduce the amount of external light passing therethrough.

Figure 3:
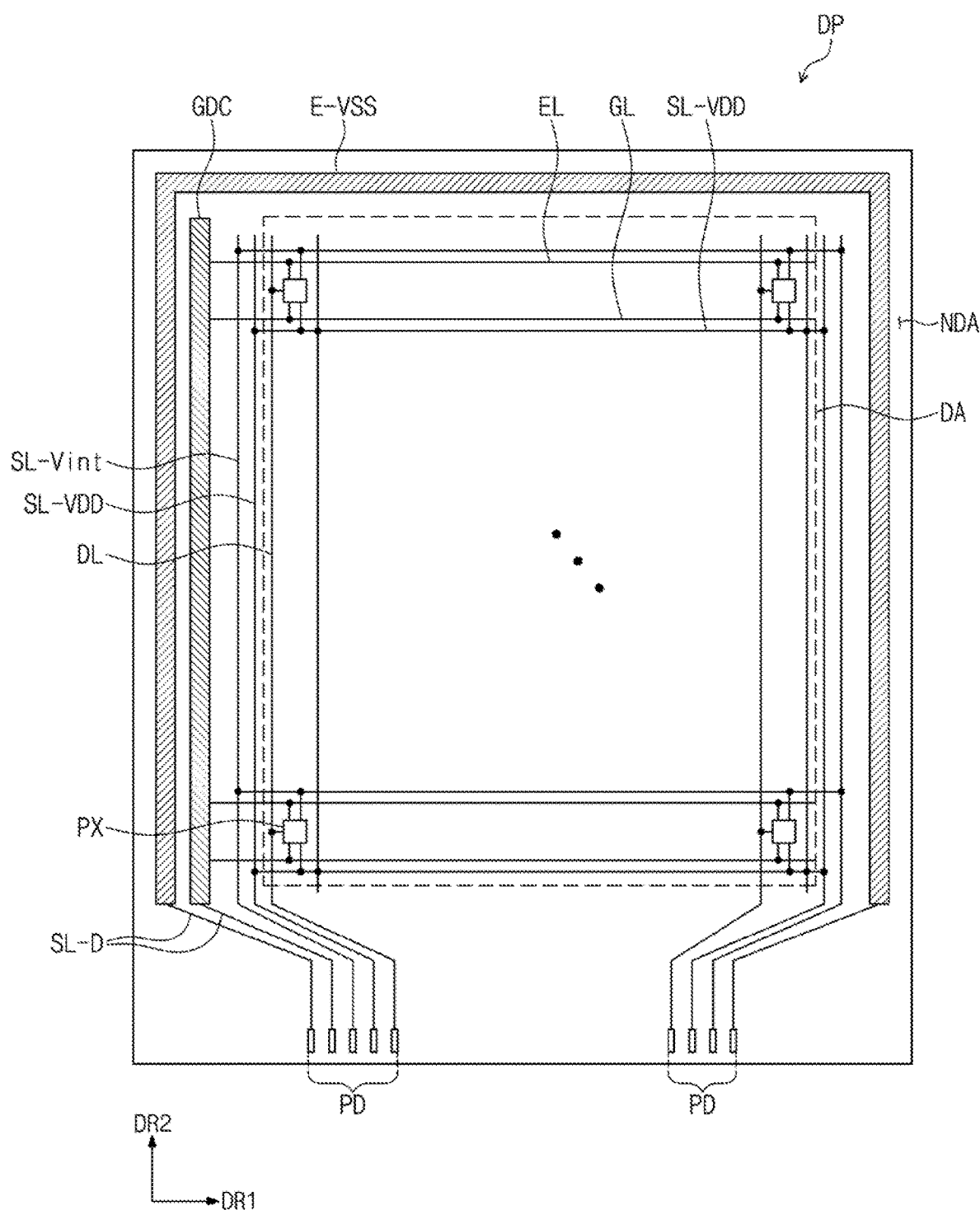
FIG. 3 is a plan view of a display panel according to an exemplary embodiment of the present inventive concepts.
Figure 4:
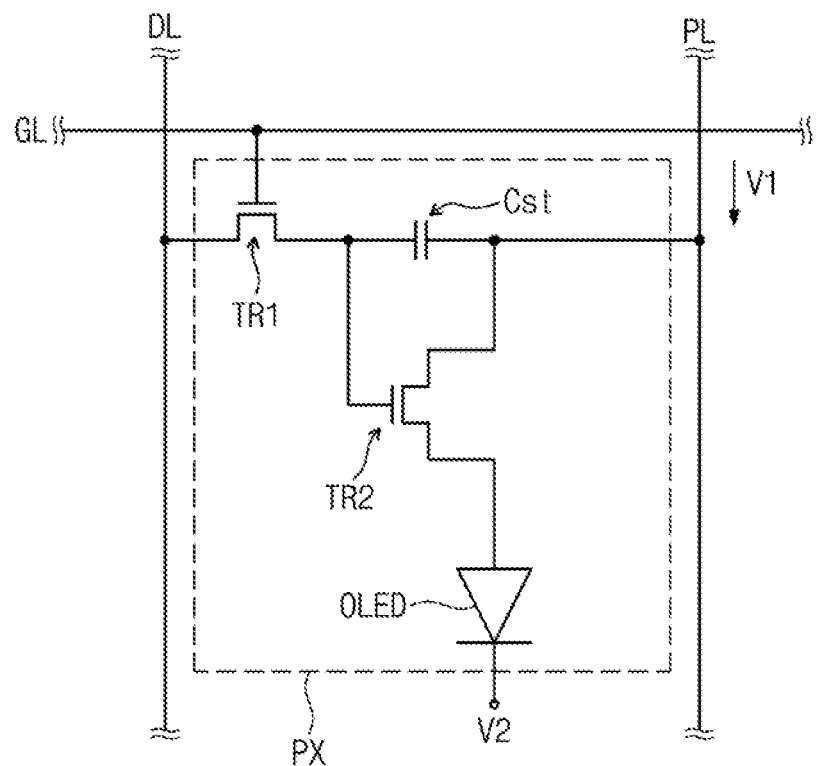
FIG. 4 is an equivalent circuit diagram of a pixel according to an exemplary embodiment of the present inventive concepts.
Figure 5:
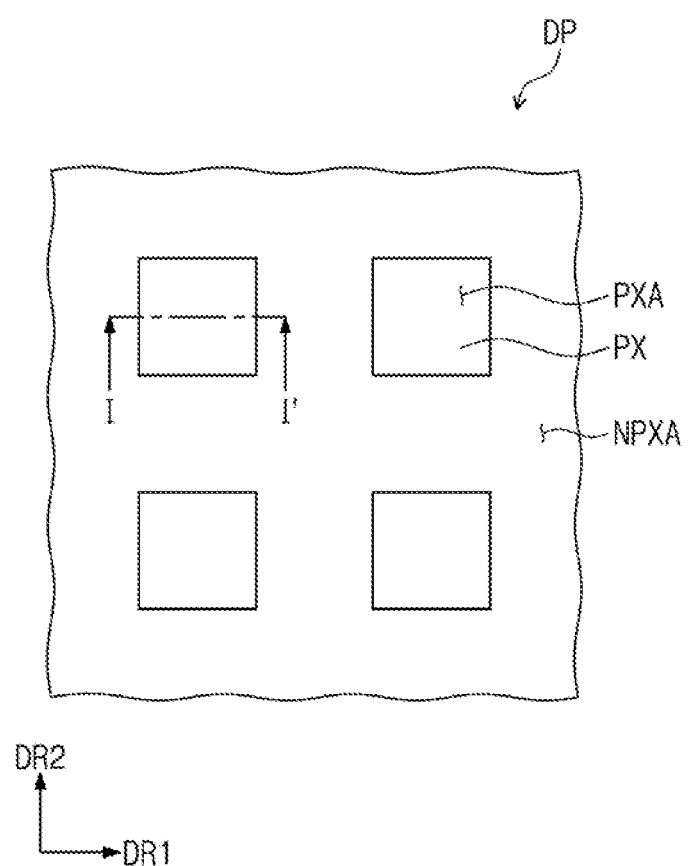
FIG. 5 is a plan view of a portion of a display panel that includes the pixels illustrated in FIGS. 3 and 4 according to an exemplary embodiment of the present inventive concepts.

FIG. 3 is a plan view of the display panel DP according to an exemplary embodiment of the present inventive concepts. FIG. 4 is an equivalent circuit diagram of a pixel PX according to an exemplary embodiment of the present inventive concepts. FIG. 5 is a plan view of a portion of a display panel that includes the pixels illustrated in FIGS. 3 and 4 according to an exemplary embodiment of the present inventive concepts.

As illustrated in FIG. 3, the display panel DP may include the display area DA and the non-display area NDA surrounding the display area. The non-display area NDA in an exemplary embodiment may be defined according to a bezel of the display area DA.

The display panel DP may include a plurality of pixels. The plurality of pixels may be disposed in the display area DA. Each of the pixels PX may include an organic light emitting diode and a pixel driving circuit connected thereto.

The display panel DP may include a plurality of signal lines and a pad unit PD. The plurality of signal lines may include a plurality of gate lines GL, a plurality of data lines DL, a plurality of light emitting lines EL, a control signal line SL-D, an initialization voltage line SL-Vint, a voltage line SL-VDD, and a power supply line E-VSS. The plurality of signal lines and the pad unit PD may be included in the circuit element layer as shown in FIG. 2.

In exemplary embodiments, at least some of the plurality of gate lines GL, the plurality of data lines DL, the plurality of light emitting lines EL, the control signal line SL-D, the initialization voltage SL-Vint, the voltage line SL-VDD, and the power supply line E-VSS may be disposed on the same layer.

The gate lines GL may be respectively connected to corresponding pixels PX from among the plurality number of pixels PX, and the data lines DL may be respectively connected to corresponding pixels PX from among the plurality number of pixels PX. Each of the light emitting lines EL may be aligned with the corresponding gate lines from among the plurality of gate lines GL. The control signal line SL-D may provide control signals to the gate driving circuit GDC. The initialization voltage line SL-Vint may provide an initialization voltage to the plurality of pixels PX. In an exemplary embodiment, the voltage line SL-VDD may be connected to the plurality of pixels PX, and provide a first voltage thereto. The voltage line SL-VDD may include a plurality of lines extended to the first direction DR1 and a plurality of lines extended to the second direction DR2. The power supply line E-VSS may be disposed to surround three sides of the display area DA in the non-display area NDA. The power supply line E-VSS may provide a common voltage (e.g. a second voltage) to the plurality of pixels PX. The common voltage may have a lower power level than the first voltage.

The display panel DP may further include a gate driving circuit GDC. The gate driving circuit GDC may be disposed at one side of the non-display area NDA and may be connected to the gate lines GL and the light emitting lines EL. The gate driving circuit GDC may be included in the circuit element layer DP-CL shown in FIG. 2. The gate driving circuit GDC may include a plurality of thin film transistors provided through the same process as that for the driving circuit of the plurality of pixels, for example, a Low Temperature Polycrystalline Silicon (LTPS) process or a Low Temperature Polycrystalline Oxide (LTPO) process. A semiconductor of the thin film transistor included in the gate driving circuit GDC may include a polysilicon or an oxide semiconductor.

The pad unit PD may include a plurality of pads. A portion of the pad unit PD may be connected to ends of the data lines DL, the control signal line SL-D, the initialization voltage line SL-Vint, and the voltage line SL-VDD. Another portion of the pad unit PD may be connected to touch signal lines of the touch sensing unit TS.

Although not illustrated, the display panel DP may further include a bank disposed between the display area DA and the pad unit PD. In addition, the display panel DP may further include a dam unit surrounding the bezel of the display area DA. The bank and the dam unit may prevent a specific layer from overflowing outside the bank or the dam unit, when the specific layer is provided by printing at the time of providing the display panel DP.

In FIG. 4, a pixel PX connected to a gate line GL, a data line DL, and a power supply line PL is exemplarily illustrated. However, the configuration of the pixel PX is not limited thereto.

The organic light emitting diode OLED may be a front light emitting type diode or a rear light emitting type diode. The pixel PX may include a first transistor TR1 (e.g., a switching transistor), a second transistor TR2 (e.g., a driving transistor), and a capacitor Cst as a pixel driving circuit for driving the organic light emitting diode OLED. Each of the first transistor TR1 and the second transistor TR2 may be a PMOS transistor or an NMOS transistor. A first power supply voltage V1 may be provided to the second transistor TR2, and a second power supply voltage V2 may be provided to the organic light emitting diode OLED. The second power supply voltage V2 may be lower than the first power supply voltage V1.

The first transistor TR1 may output a data signal to be applied to the data line in response to a scan signal applied to scan lines GL. The capacitor Cst may charge a voltage corresponding to the data signal received from the first transistor TR1.

The second transistor TR2 may be connected to the organic light emitting diode OLED. The second transistor TR2 may control a driving current flowing through the organic light emitting diode OLED in correspondence to a charge amount stored in the capacitor Cst. The organic light emitting diode OLED may emit light during a turn-on period of the second transistor TR2.

FIG. 5 is a plan view of a portion of the display panel including the pixels illustrated in FIGS. 3 and 4.

In reference to FIG. 5, the pixel PX may be provided in plurality and disposed to be adjacent to each other. In an exemplary embodiment of the present inventive concepts, it is exemplarily illustrated that the plurality of pixels PX may be arranged in an array to be adjacent to each other along the first direction DR1 and the second direction DR2. However, exemplary embodiments of the present inventive concepts are not limited thereto, and an array type of the plurality of pixels PX may be variously changed.

The pixel PX may display any one of red, green, and blue colors. However, exemplary embodiments of the present inventive concepts are not limited thereto, and the pixel PX may display any one of various colors other than the red, green, and blue colors.

An area in which the pixel PX is disposed may include an emission area PXA and a non-emission area NPXA. The non-emission area NPXA may surround the emission area PXA.

Figure 6:
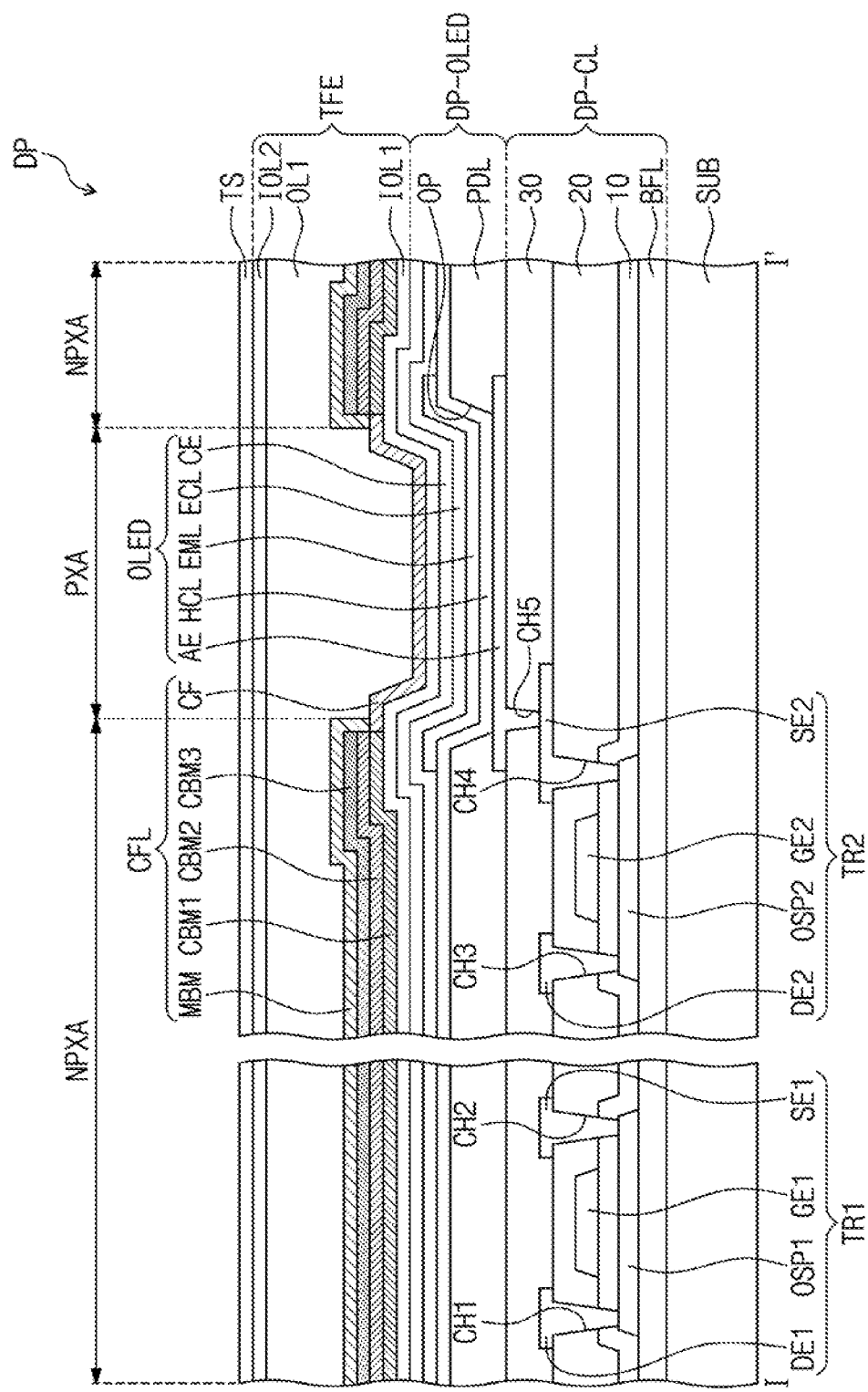
FIG. 6 is a cross-sectional view taken along line I-I' of FIG. 5 according to an exemplary embodiment of the present inventive concepts.

FIG. 6 is a cross-sectional view cut along a line I-I' of FIG. 5.

In relation to FIG. 6, the display panel DP may include the base layer SUB, a circuit element layer DP-CL, a display element layer DP-OLED, a color filter layer CFL, and an encapsulation layer TFE.

The circuit element layer DP-CL may include a first transistor TR1, a second transistor TR2, and a capacitor Cst, which are described in relation to FIG. 4. The circuit element layer DP-CL may include at least one inorganic layer and at least one organic layer to provide the first transistor TR1, the second transistor TR2, and the capacitor Cst. The circuit element layer DP-CL may include a buffer layer BFL that is an inorganic layer, a first intermediate inorganic layer 10 and a second intermediate inorganic layer 20. The circuit element layer DP-CL may also include an intermediate organic layer 30 that is an organic layer.

In exemplary embodiments, the inorganic layers may include a silicon nitride, a silicon oxynitride, etc. In exemplary embodiments, the organic layer may include at least any one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin. The circuit element may include conductive patterns and/or semiconductor patterns.

The buffer layer may improve coherence between the base layer SUB and conductive patterns or semiconductor patterns. A barrier layer for preventing an inflow of a foreign material may be further disposed on the upper surface of the base layer SUB. The buffer layer BFL and the barrier layer may be selectively disposed/omitted.

A semiconductor pattern OSP1 (hereinafter, a first semiconductor pattern) of the first transistor TR1 and a semiconductor pattern OSP2 (hereinafter, a second semiconductor pattern) of the second transistor TR2 may be disposed on the buffer layer BFL. The first semiconductor pattern OSP1 and the second semiconductor pattern OSP2 may be selected front among an amorphous silicon, a polysilicon and a metal oxide semiconductor.

The first intermediate inorganic layer 10 may be disposed on the first semiconductor pattern OSP1 and the second semiconductor pattern OSP2. A control electrode GE1 (hereinafter, a first control electrode) of the first transistor TR1 and a control electrode GE2 (hereinafter, a second control electrode) of the second transistor TR2 may be disposed on the first intermediate inorganic layer 10. The first control electrode GE1 and the second control electrode GE2 may be manufactured according to the same photolithography process as that of the scan lines GL.

The second intermediate inorganic layer 20 may be configured to cover the first control electrode GE1 and the second control electrode GE2 may be disposed on the first intermediate inorganic layer 10. An input electrode GE1 (hereinafter, a first input electrode) and an output electrode SE1 (hereinafter, a first output electrode) of the first transistor TR1, and an input electrode DE2 (hereinafter, a second input electrode) and an output electrode SE2 (hereinafter, a second output electrode) of the second transistor TR2 may be disposed on the second intermediate inorganic layer 20.

The first input electrode DE1 and the first output electrode SE1 may be connected to the first semiconductor pattern OSP1 through a first through-hole CH1 and a second through-hole CH2 configured to penetrate respectively through the first intermediate inorganic layer 10 and the second intermediate inorganic layer 20. The second input electrode DE2 and the output electrode SE2 may be connected to the second semiconductor pattern OSP2 through a third through-hole CH3 and a fourth through-hole CH4 configured to penetrate respectively through the first intermediate inorganic layer 10 and the second intermediate inorganic layer 20. In another embodiment of the present inventive concepts, a portion of the first transistor TR1 and the second transistor TR2 may be modified to include a bottom-gate structure.

The intermediate organic layer 30 that is configured to cover the first input electrode DE1, the second input electrode DE2, the first output electrode SE1, and the second output electrode SE2 may be disposed on the second intermediate inorganic layer 20. The intermediate organic layer may provide a flat plane.

The display element layer DP-OLED may be disposed on the intermediate organic layer 30. The display element layer DP-OLED may include the emission area definition layer PDL and the organic light emitting diode OLED. The emission area definition layer PDL may include an organic material like the intermediate organic layer 30. A first electrode E may be disposed on the intermediate layer 30. The first electrode AE may be connected to the second output electrode SE2 through a fifth through-hole CH5 configured to penetrate through the intermediate organic layer 30. An opening part OP is defined in the emission area definition layer PDL. The opening part OP of the emission area definition layer PDL may expose at least a part of the first electrode AE.

The pixel PX may be disposed on a pixel area on a plane. The pixel area may include the emission area PXA and the non-emission area NPXA adjacent to the emission area PXA. In the exemplary embodiment shown in FIG. 6, the emission area PXA may be defined to correspond to a partial area of the first electrode AE which is exposed by the opening part OP. The emission area PXA may be an area in which light having been emitted from the organic light emitting diode OLED is emitted externally, and the non-emission area NPXA may be an area in which light having been emitted from the organic light emitting diode OLED is absorbed and not emitted externally. The non-emission area NPXA may be defined between a plurality of emission areas PXA.

A hole control layer HCL may be commonly disposed in the emission area PXA and the non-emission area NPXA. Although not illustrated separately, the common layer such as the hole control layer HCL may be commonly provided in the plurality of pixels PX (see FIG. 3).

A light emission layer may be disposed on the hole control layer HCL. The light emission layer EML may be disposed on an area corresponding to the opening part OP. The light emission layer EML may include discrete, separated portions provided to overlap each of the plurality of pixels PX. The light emission layer EML may include an organic material and/or an inorganic material. In the exemplary embodiment shown in FIG. 6, the patterned light emission layer EML is exemplarily illustrated, but the light emission layer EML may be commonly disposed in the plurality of pixels PX. The light emission layer EML may generate red, green, blue, or white light. However, the color of the generated light is not limited thereto. Furthermore, the light emission layer EML may have a multi-layer structure.

An electron control layer ECL may be disposed on the light emission layer EML. Although not illustrated separately, the electron control layer ECL may be commonly provided on the plurality of pixels PX (see FIG. 3).

A second electrode CE may be disposed on the electron control layer ECL. The second electrode CE may be commonly disposed on the plurality number of pixels PX. The color filter layer CFL and the encapsulation layer TFE may be disposed on the second electrode CE.

In an exemplary embodiment of the present inventive concepts, the color filter layer CFL may be disposed in the encapsulation layer TFE.

The encapsulation layer TFE may include at least one encapsulation inorganic layer and at least one encapsulation organic layer. In an exemplary embodiment, the encapsulation inorganic layer and the encapsulation organic layer may be alternately laminated.

In an exemplary embodiment of the present inventive concepts, it is exemplarily illustrated that the encapsulation layer TFE may include first and second encapsulation inorganic layers IOL1 and IOL2, and a first encapsulation organic layer OL1. However, exemplary embodiments of the encapsulation layer TFE are not limited to this configuration.

The first encapsulation inorganic layer IOL1 may be disposed on the second electrode CE. The first encapsulation inorganic layer IOL1 may entirely cover an upper surface of the second electrode CE.

In an exemplary embodiment of the inventive concepts, a capping layer configured to cover the second electrode CE may be further disposed between the first encapsulation inorganic layer IOL1 and the second electrode CE. In this embodiment, the first encapsulation inorganic layer IOL1 may directly cover the capping layer.

The color filter layer CFL may be disposed on the first encapsulation inorganic layer IOL1.

The color filter layer CFL may include a color filter CF, a plurality of color shielding layers, and an auxiliary shielding layer MBM. For example, in an exemplary embodiment, the color filter CF may include first to third color shielding layers CBM1 to CBM3.

The color filter CF may be disposed to overlap the emission area PXA. The color filter CF may permit the transmission of one of various colors, such as red, green, blue and the like. Although not illustrated in FIG. 6, the color filters CF disposed in the emission areas PXA adjacent to each other among the plurality of emission areas PXA may have different colors. In an exemplary embodiment, the color filter CF may not overlap the emission area definition layer PDL.

The first to third color shielding layers CBM1 to CBM3 may be disposed in the non-emission area NPXA. The first to third color shielding layers CBM1 to CBM3 may overlap the emission area definition layer PDL.

In an exemplary embodiment, the first to third color shielding layers CBM1 to CBM3 may be sequentially disposed on the first encapsulation inorganic layer IOL1. The first to third color shielding layers CBM1 to CBM3 may have different colors. Any one of the first to third shielding layers CBM1 to CBM3 may have the same color as the color filter CF disposed in the adjacent emission area layer PXA. For example, when the emission area PXA illustrated in FIG. 6 is defined as an area configured to display the green color, the color filter CF may have the green color and the first color shielding layer CBM1 may have the green color.

In an exemplary embodiment, each of the first to third color shielding layers CBM1 to CBM3 may not have a black color, but the first to third color shielding layers CBM1 to CBM3 may be combined to make the black color. Accordingly, the first to third color shielding layers CBM1 to CBM3 may be configured to help absorb incident light and prevent the transmission of such light.

In an exemplary embodiment of the present inventive concepts, the first color shielding layer may have a green color, the second color shielding layer may have a red color, and the third color shielding layer may have a blue color. The first to third color shielding layers CBM1 to CBM3 may include an organic material.

A color shielding layer having the same color as the color filter CF among the first to third color shielding layers CBM1 to CBM3 disposed adjacent to the color filter CF may have a shape associated with the color filter CF (e.g., such as to provide a continuous surface therebetween).

In another embodiment of the present inventive concepts, at least one or more color shielding layers may be further included in addition to the first to third color shielding layers CBM1 to CBM3.

The auxiliary shielding layer MBM may be disposed on the first to third color shielding layers CBM1 to CBM3. For example, the auxiliary shielding layer MBM may be disposed in the non-emission area NPXA to cover the first to third color shielding layers CBM1 to CBM3. The auxiliary shielding layer MBM may not only extend to cover an upper surface of the third color shielding layer CBM3, but also cover side surfaces of the first to third color shielding layers CBM1 to CBM3.

The auxiliary shielding layer MBM may compensate for reflection ratios of the first to third color shielding layers CBM1 to CBM3. For example, the auxiliary shielding layer MBM may have a lower reflection ratio than that of a laminated structure in which the first to third color shielding layers CBM1 to CBM3 are combined. Therefore, the color filter layer may substantially block the reflection of external light.

The auxiliary shielding layer MBM may include a metal oxide or a metal alloy oxide. In detail, the auxiliary shielding layer MBM may include at least one of CuO, CrO, FeO, $Ni_2O_3$, and $MoTaO_x$.

The first to third color shielding layers CBM1 to CBM3 and the auxiliary shielding layer MBM may help block the reflection of external light inside the display panel DP by absorbing such light. Due to the display panel DP according to the exemplary embodiment of the present inventive concept, a separate polarization film is not required for preventing reflection of the external light.

The first encapsulation organic layer OL1 may be disposed on the auxiliary shielding layer MBM. The auxiliary shielding layer MBM may contact the first encapsulation organic layer OL1. In exemplary embodiments, the first encapsulation organic layer OL1 may be provided using an inkjet printing manner or by coating a composite including an acrylic-based monomer.

The second encapsulation inorganic layer IOL2 may be disposed on the first encapsulation organic layer OL1.

The first and second encapsulation inorganic layers IOL1 and IOL2 may have an identical inorganic material or different materials. Materials forming the first and second encapsulation inorganic layers IOL1 and IOL2 are not particularly limited, and may include a silicon nitride, a silicon oxynitride, and a silicon oxide, etc.

A viewing angle-luminance ratio may be defined as a luminance of obliquely emitted light to a luminance of forward emitted light. A configuration of a color filter layer for absorbing external light may have a larger area as the height thereof becomes lower while still maintaining the viewing angle-luminance ratio. As the area of the configuration of the color filter layer for absorbing external light becomes larger, a reflection ratio of the external light incident to the display panel DP is lowered. In addition, as the height of the configuration of a color filter layer for absorbing external light decreases, a viewing angle-luminance ratio may be increased.

For the display panel DP according to the exemplary embodiment of the present inventive concepts, the color filter layer CFL may be disposed in the encapsulation layer TFE. Therefore, the height of the color shielding layers CFM1 to CFM3 and the auxiliary shielding layer MBM (e.g., a distance from the base layer SUB) which are configured to absorb external light may be maintained relatively low in comparison to a comparative example in which a configuration for absorbing external light is disposed on (e.g., directly above) the encapsulation layer TFE. Accordingly, the display panel DP of the exemplary embodiments of the present inventive concepts provide a relatively lower external light reflection ratio in comparison to the comparative example. In addition, the display panel DP of the exemplary embodiments of the present inventive concepts may provide a higher viewing angle-luminance ratio in comparison to the comparative example.

Figure 7:
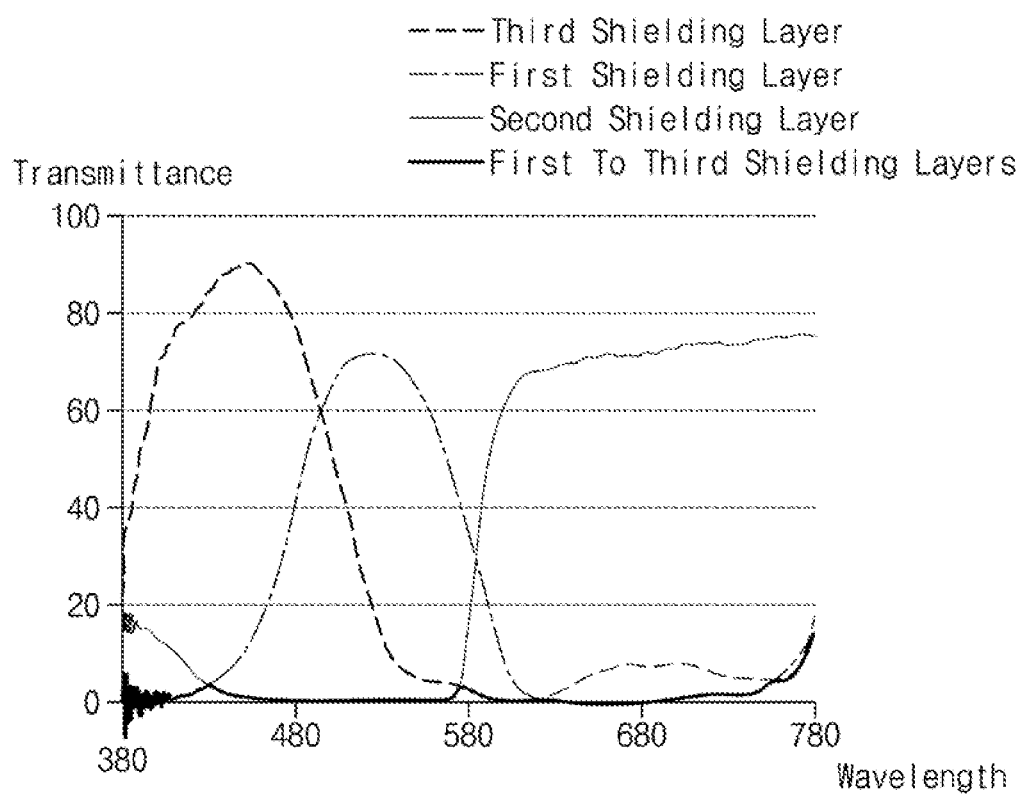
FIG. 7 is a result graph obtained by measuring respective transmittances of first to third color blocking layers and a transmittance of a structure in which the first to third color blocking layers are combined according to an exemplary embodiment of the present inventive concepts.

FIG. 7 is a result graph obtained by measuring respective transmittances of first to third color blocking layers individually and a transmittance of a structure in which the first to third color blocking layers are combined in an exemplary embodiment of the present inventive concepts.

In relation to FIGS. 6 and 7, it may be confirmed that a structure, in which the first to third color shielding layers CBM1 to CBM3 are combined, has a transmittance of lower than 5% and plays a role of absorbing incident light to block incident light from being transmitted.

Figure 8:
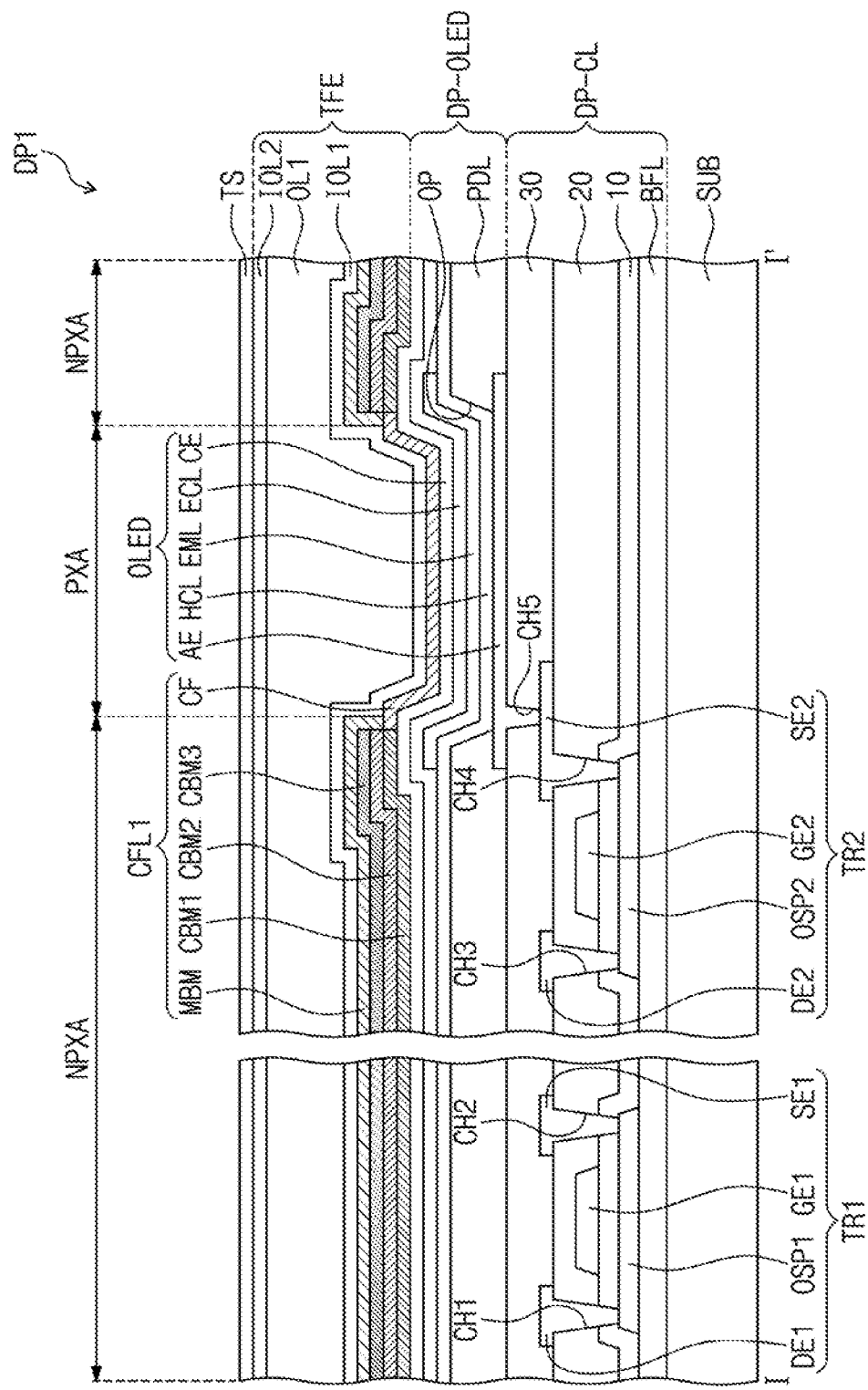
FIG. 8 is a cross-sectional view taken along line I-I' of FIG. 5 in accordance with another exemplary embodiment of the present inventive concepts.

FIG. 8 is a cross-sectional view cut along a line I-I' of FIG. 5 in another exemplary embodiment of the present inventive concepts.

The display panel DP1 in relation to FIG. 8 will be mainly described with respect to differences from the display panel described in relation to FIG. 6, and descriptions about the remaining components will be according to those of FIG. 6.

In the exemplary embodiment shown in FIG. 8, the color filter layer CFL1 may be disposed between the second electrode CE2 and the encapsulation layer TFE. The color filter layer CFL1 may be disposed below a bottom surface of the first encapsulation inorganic layer IOL1.

The color filter layer CFL1 may include the first to third color shielding layers CBM1 to CBM3 and the auxiliary shielding layer MBM. The configuration of the color filter layer CFL1 may be substantially the same as that of the color filter layer CFL described in relation to FIG. 6, and thus a detailed description thereabout will be omitted.

For the display panel DP1 according to the exemplary embodiment of FIG. 8, in comparison to the display panel DP described in relation to FIG. 6, the height of the color filter layer CFL1 may be lowered, such as in an amount equal to the thickness of the first encapsulation inorganic layer IOL1. Therefore, a lower reflection ratio of external light may be secured in comparison with the display panel of FIG. 6.

Figure 9:
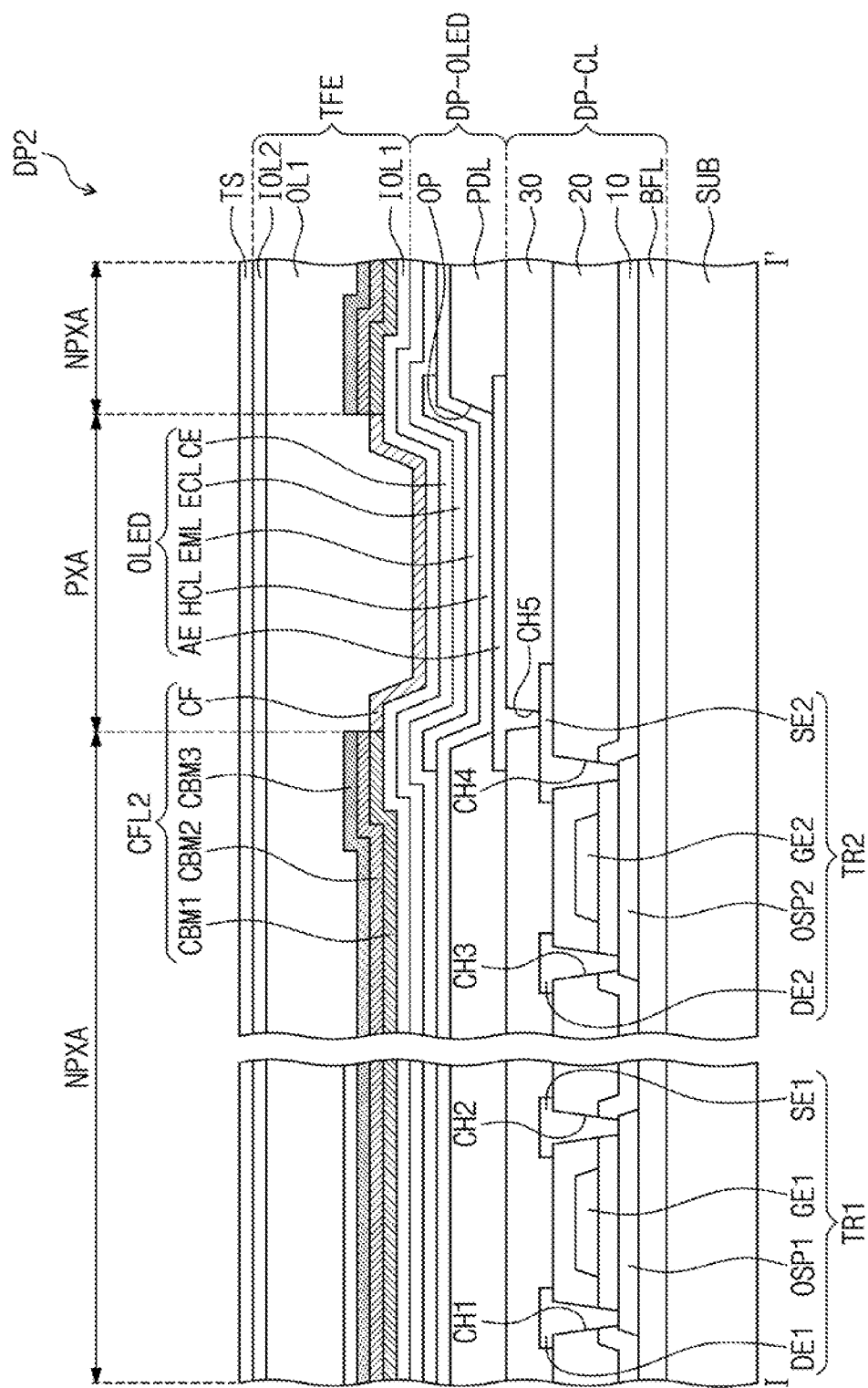
FIG. 9 is a cross-sectional view taken along line I-I' of FIG. 5 in accordance with another exemplary embodiment of the present inventive concept.

FIG. 9 is a cross-sectional view cut along a line I-I' of FIG. 5 in accordance with another exemplary embodiment of the present inventive concepts.

The display panel DP2 to be described in relation to FIG. 9 has a difference in that the color filter layer CFL does not include an auxiliary shielding layer MBM as compared with the exemplary embodiment of the display panel DP described in FIG. 6.

In the exemplary embodiment shown in FIG. 9, a color filter layer CFL2 may be disposed between the first encapsulation inorganic layer IOL1 and the first encapsulation organic layer OL1. The color filter layer CFL2 may include the first to third color filters CBM1 to CBM3. The third color shielding layer CBM3 may contact the first encapsulation inorganic layer IOL1.

Accordingly, in the display panel DP2 according to the exemplary embodiment of FIG. 9, the first to third color filters CBM1 to CBM3 of the color filter layer may absorb the external light to block the transmission thereof. In comparison to the display panel DP of FIG. 8, the process of the auxiliary shielding layer MBM may be omitted to achieve simplification of a manufacturing process and cost reduction.

FIGS. 10A to 10F are cross-sectional views that sequentially illustrate a manufacturing method of a display apparatus according to an exemplary embodiment of the present inventive concepts.

FIGS. 10A to 10F illustrate first to third emission areas PXA1, PXA2 and PXA3, and non-emission areas NPXA disposed adjacent to the first to third emission areas PXA1, PXA2 and PXA3. The first to third emission areas PXA1, PXA2 and PXA3 may be defined as areas in which images of different colors are displayed.

Figure 10A:
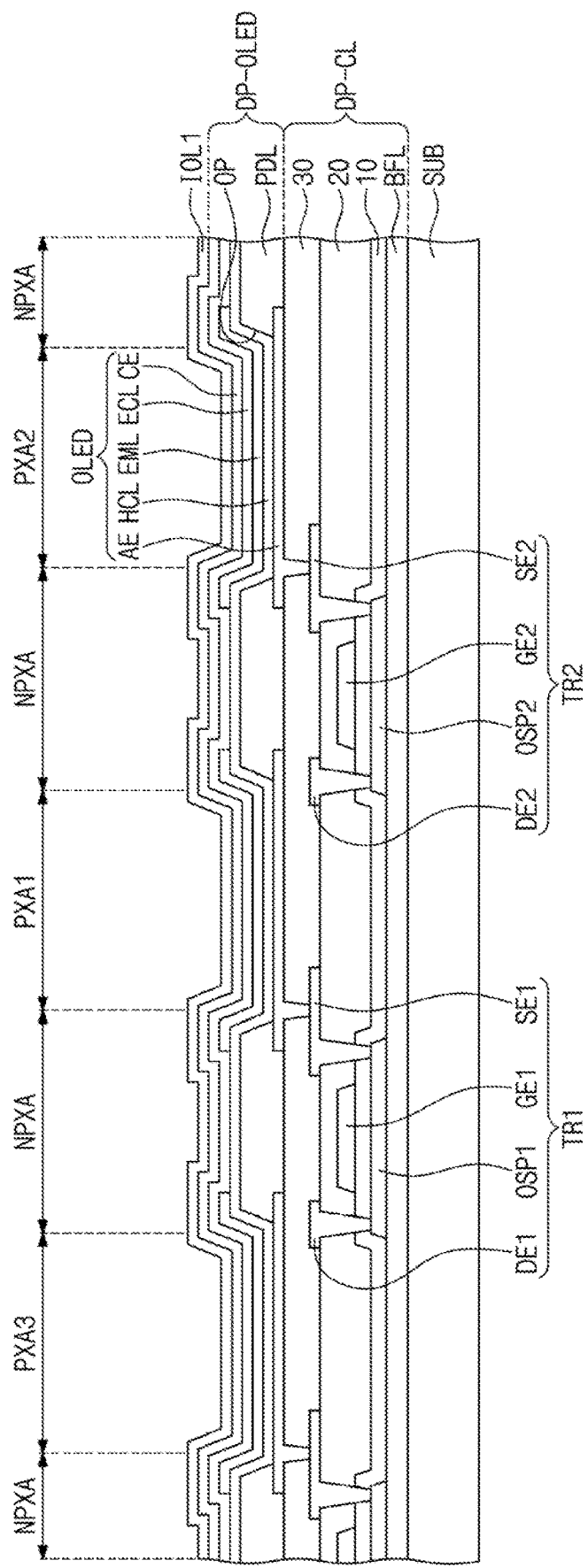
FIGS. 10A to 10F are cross-sectional views that sequentially illustrate a manufacturing method of a display apparatus according to an exemplary embodiment of the present inventive concepts.

As shown in FIG. 10A, a circuit element layer DP-CL and a display element layer DP-OLED may be provided on a base layer SUB. Detailed methods for providing the circuit element layer DP-CL and the display element layer DP-OLED will be omitted.

Figure 10B:
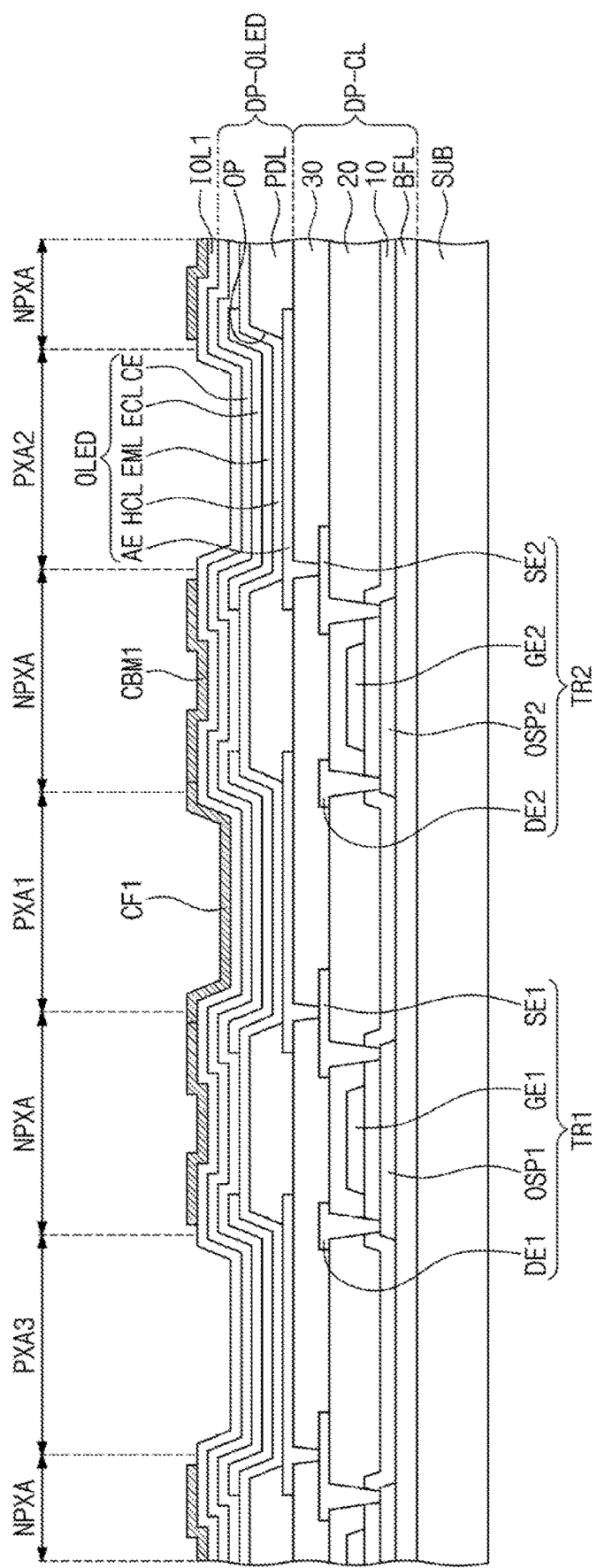

A first encapsulation inorganic layer IOL1 may be provided on the display elements layer DP-OLED. As shown in FIG. 10B, a first color filter CF1 and a first color shielding, layer CBM1 may be provided on the first encapsulation inorganic layer IOL1.

The first color filter CF1 and the first color shielding layer CBM1 may be provided by applying and patterning an organic material of a first color on the first encapsulation inorganic layer IOL1. For example, the first color may be green.

The first color filter CF1 may be provided in the first emission area PXA1 and the first color shielding layer CBM1 may be provided in the non-emission area NPXA.

Figure 10C:
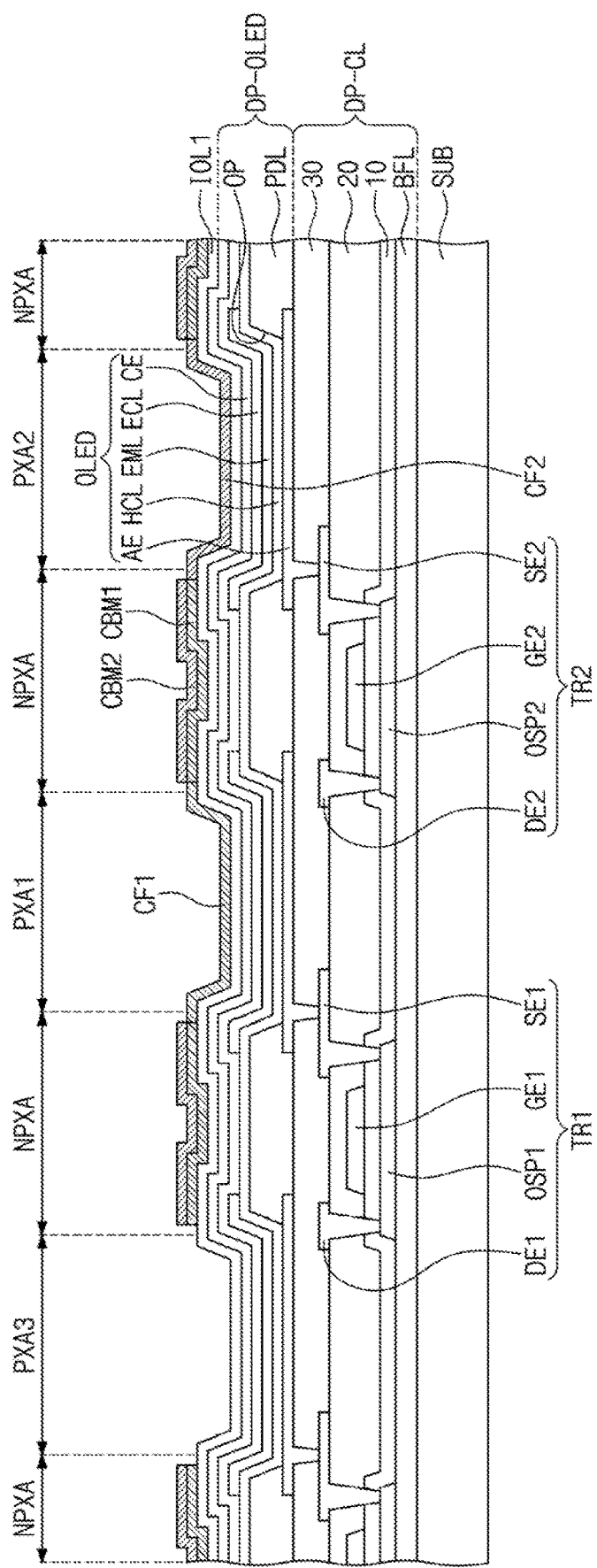

As shown in FIG. 10C, a second color filter CF2 and a second color shielding layer CBM2 may be provided on the first encapsulation inorganic layer IOL1 on which the first color filter CF1 and the first color shielding layer CBM1 are provided.

The second color filter CF2 and the second color shielding layer CBM2 may be provided by applying and patterning an organic material of a second color on the first encapsulation inorganic layer IOL1. For example, the second color may be red.

The second color filter CF2 may be provided in the second emission area PXA2. The second color shielding layer CBM2 may be disposed in the non-emission area NPXA and may overlap the first color shielding layer CBM1.

Figure 10D:
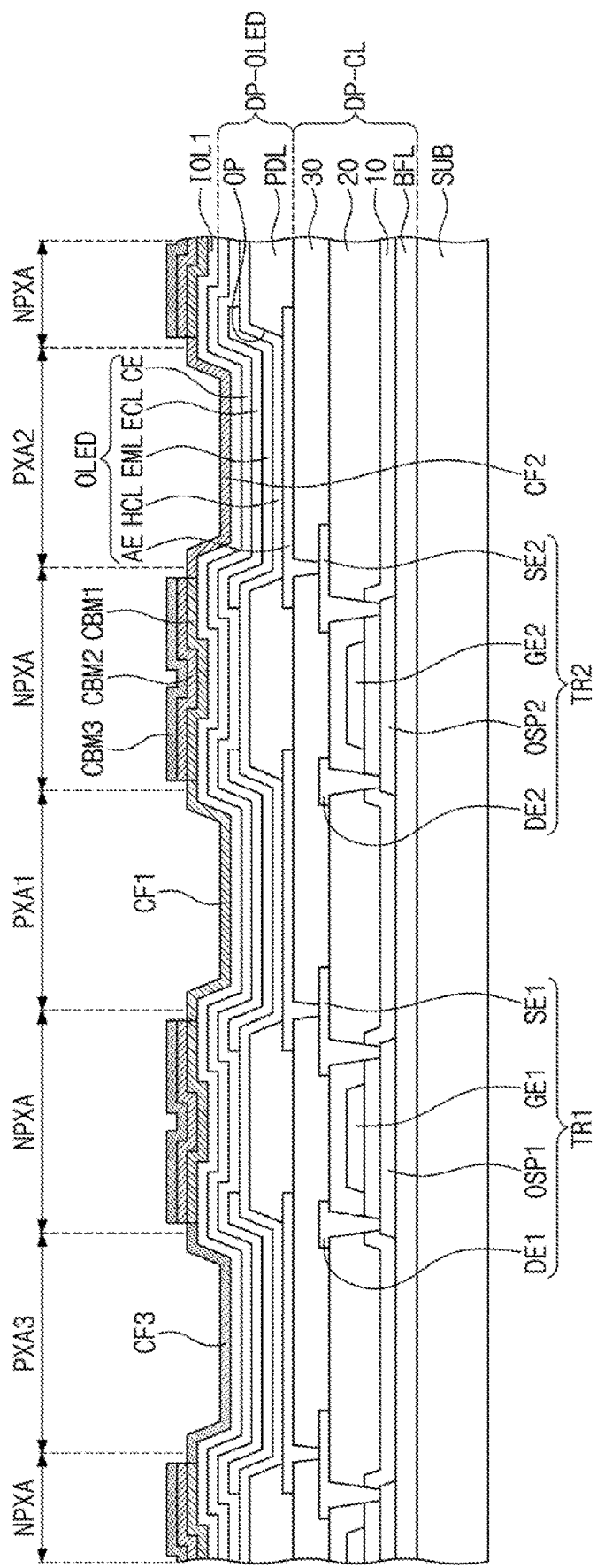

As shown in FIG. 10D, a third color filter CF3 and a third color shielding layer CBM3 may be provided on the first encapsulation inorganic layer IOL1 on which the first color filter CF1, the second color filter CF2, the first color shielding layer CBM1 and the second color shielding layer CBM2 are provided.

The third color filter CF3 and the third color shielding layer CBM3 may be provided by applying and patterning an organic material of a third color on the first encapsulation inorganic layer IOL1. For example, the third color may be blue.

The third color filter CF3 may be provided in the third emission area PXA3. The third color shielding layer CBM3 may be disposed in the non-emission area NPXA and may be provided on the second color shielding layer CBM2 in an overlapping manner.

Figure 10E:
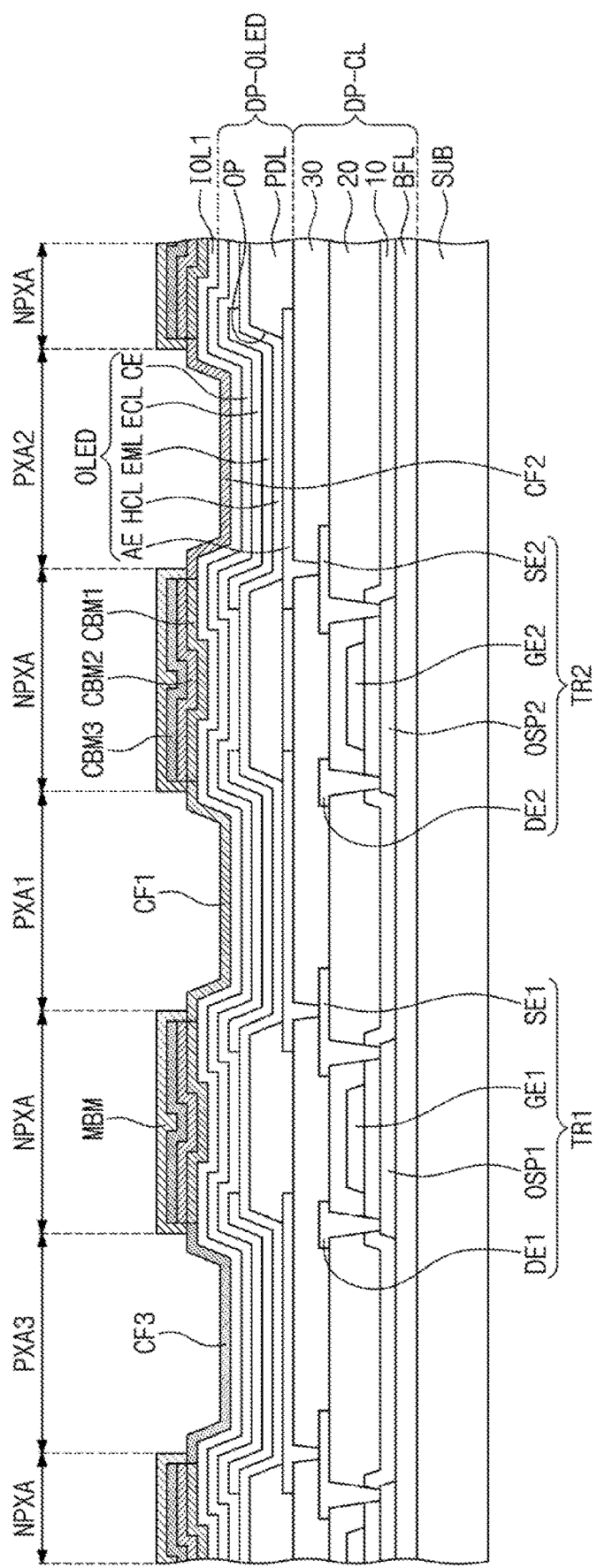

As shown in FIG. 10E, the auxiliary shielding layer MBM may be provided on the first encapsulation inorganic layer IOL1 on which the first to third color filters CF1 to CF3 and the first to third color shielding layers CBM1 to CBM3 are provided.

The auxiliary shielding layer MBM may be provided by evaporating a metal oxide or a metal alloy oxide, and then performing patterning. In an exemplary embodiment of the present inventive concepts, the metal oxide may include at least one of CuO, CrO, FeO, Ni2O3, and MoTaOx.

The auxiliary shielding layer MBM may be provided to entirely cover an upper surface of the third color shielding layer CBM3 and the side surfaces of the first to third shielding layers CBM1 to CBM3.

Figure 10F:
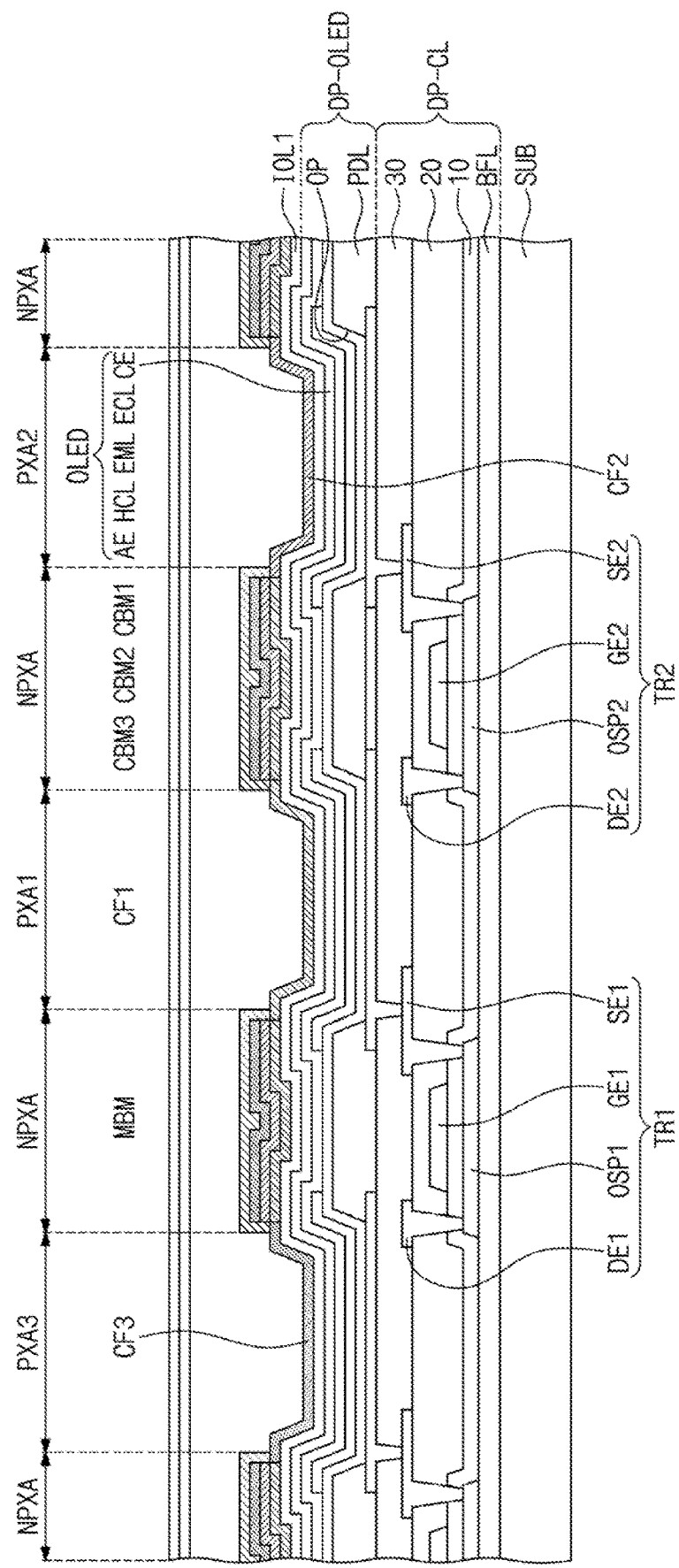

As shown in FIG. 10F, a first encapsulation organic layer OL1 and a second encapsulation inorganic layer IOL2 may be provided on the first encapsulation inorganic layer IOL1 on which the auxiliary shielding layer MBM is provided. A touch sensing unit TS may be provided on the second encapsulation inorganic layer IOL2.

Figure 11:
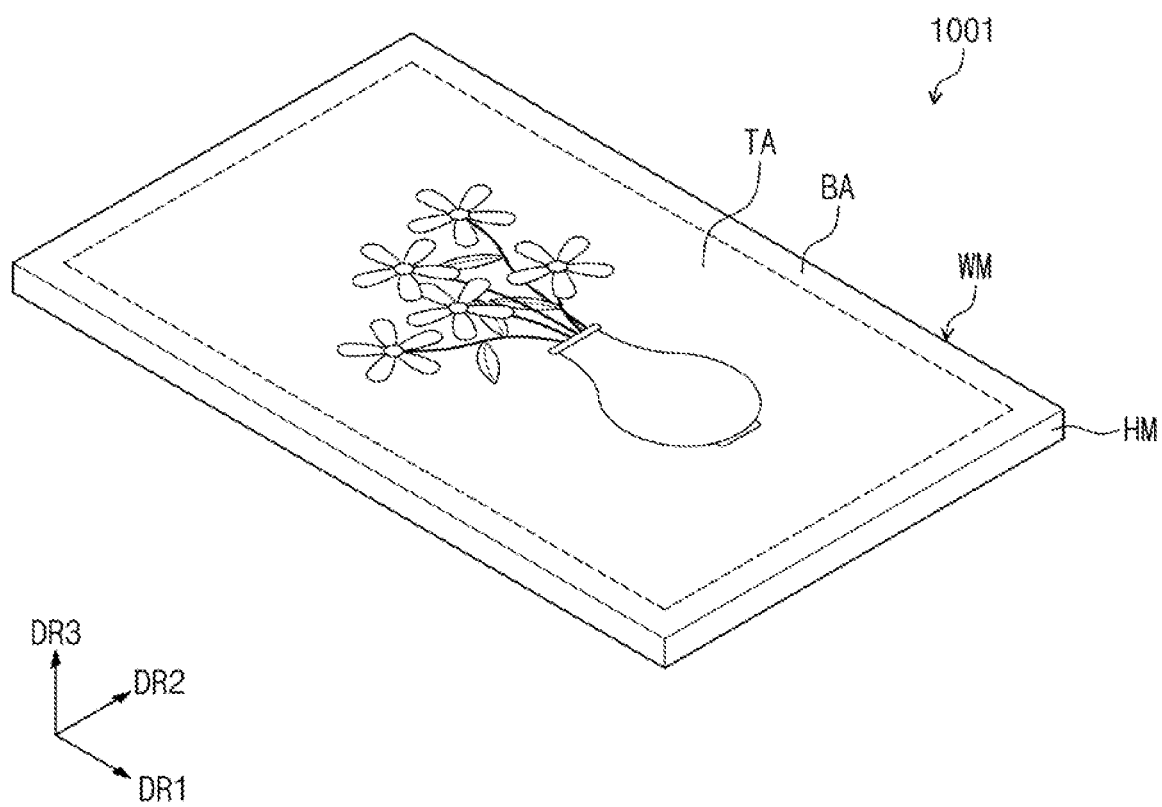
FIG. 11 and FIG. 12 are perspective views of display apparatuses according to other exemplary embodiments of the present inventive concepts.

FIG. 11 is a perspective view of a display apparatus 1001 according to another exemplary embodiment of the present inventive concepts.

The display apparatus 1001 to be described in relation to FIG. 11 may further include a housing member HM as compared to the display apparatus 1000 described in relation to FIG. 1.

The housing member HM may provide a prescribed internal space. The display panel DP (see FIG. 1) may be accommodated in the internal space. In the internal space of the housing member HM, besides the display panel DP, various electronic components. For example, a power supply unit, a storage device, a sound input and output module, a camera, and the like, may be disposed in the internal space.

In the display apparatus 1001 shown in FIG. 11, the display is shown as a flat display apparatus. However, in other exemplary embodiments, the display apparatus may have a curved surfaces, may be foldable, etc.

Figure 12:
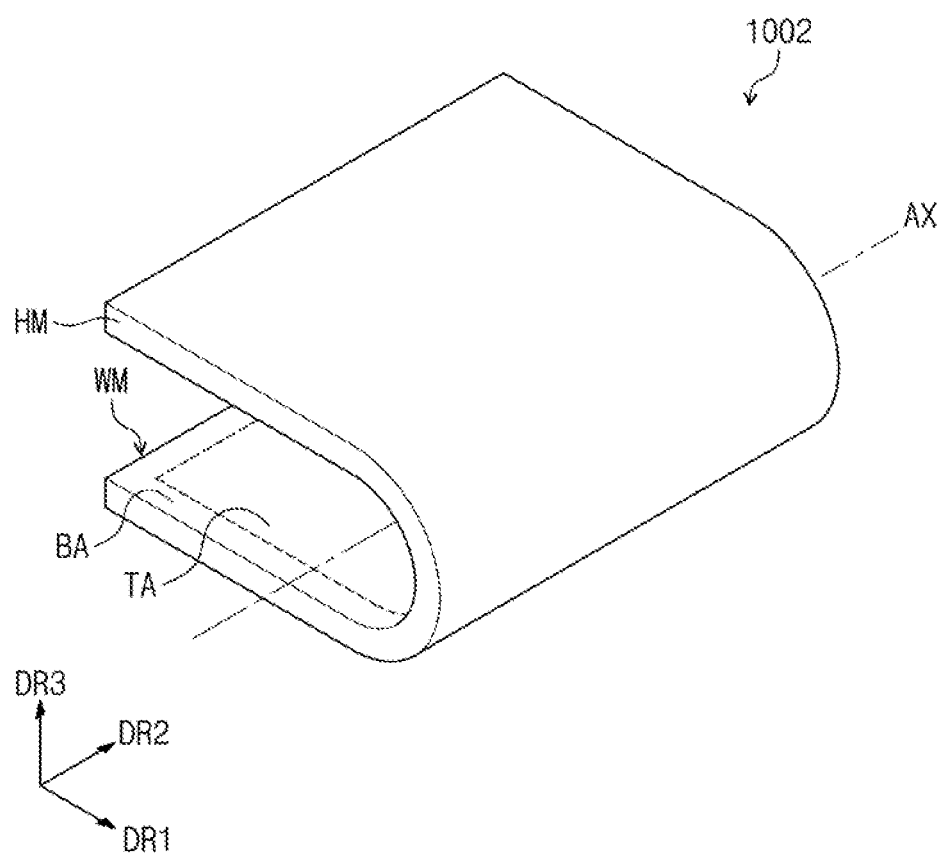

FIG. 12 is a perspective view of a display apparatus 1002 according to another exemplary embodiment of the present inventive concepts.

The display apparatus 1002 illustrated in FIG. 12 may be folded. For example, the display apparatus 1002 may be folded about a folding axis AX. The display apparatus 1002 in FIG. 12 is illustrated as an in-folding display apparatus in which a display surface, on which an image is displayed may be folded inwardly. However, the exemplary embodiments of the present inventive concepts are not limited thereto. For example, the display apparatus 1002 may be an out-folding display apparatus in which a display surface, on which an image is displayed, is folded outwardly. In other exemplary embodiments, the display apparatus may include both in-folding and out-folding portions.

As an example, the folding axis AX may be extended in parallel to the short sides of the display apparatus 1002. However, exemplary embodiments of the present inventive concepts are not limited thereto. For example, the folding axis AX may be extended in parallel to the long sides of the display apparatus 1002.

In a display panel according to exemplary embodiments of the present inventive concepts, a color filter layer may be disposed in a lower part of an upper surface of an encapsulation layer. Therefore, the heights of the color blocking layers and an auxiliary shielding layer for blocking external light may be maintained relatively low. Consequently, the display apparatus according to exemplary embodiments of the present inventive concepts may secure a low external light reflection ratio and a high viewing angle to luminance ratio.

While this invention has been described with reference to exemplary embodiments thereof, it will be clear to those of ordinary skill in the art to which the invention pertains that various changes and modifications may be made to the described embodiments without departing from the spirit and technical area of the invention as defined in the appended claims and their equivalents.

Accordingly, the scope of the present inventive concepts shall not be restricted or limited by the foregoing description, but be determined by the broadest permissible interpretation of the following claims.

What is claimed is:

1. A display apparatus comprising:
   a base layer comprising an emission area and a non-emission area adjacent to the emission area;
   a circuit element layer disposed on the base, layer;
   a display element layer disposed on the circuit element layer, the display element layer including an organic light emitting diode;
   an encapsulation layer disposed on the display element layer and configured to encapsulate the organic light emitting diode; and
   a color filter layer disposed in the encapsulation layer and in direct contact with a bottommost layer of the encapsulation layer,
   wherein the color filter layer includes a color shielding layer having a plurality of layers disposed in the non emission area and a color filter disposed in the emission area.

2. The display apparatus of claim 1, wherein the color shielding layer comprises:
   a first color shielding layer having a first color;
   a second color shielding layer disposed on the first color shielding layer and having a second color that is different from the first color; and
   a third color shielding layer disposed on the second color shielding layer and having a third color that is different from the first and second colors,
   wherein a color of the color filter is one of the first to third colors.

3. The display apparatus of claim 2, wherein the first color is green, the second color is red, and the third color is blue.

4. The display apparatus of claim 2, wherein a material of the color filter is identical to a material of one of the first to third color shielding layers.

5. The display apparatus of claim 2, further comprising:
an auxiliary shielding layer disposed in the non-emission area and disposed on the third color shielding layer.

6. The display apparatus of claim 5, wherein the auxiliary shielding layer is configured to cover side surfaces of the first to third color shielding layers.

7. The display apparatus of claim 5, wherein the auxiliary shielding layer comprises a metal oxide or a metal alloy oxide.

8. The display apparatus of claim 7, wherein the auxiliary shielding layer comprises at least one of CuO, CrO, FeO, $Ni_2O_3$ or $MoTaO_x$.

9. The display apparatus of claim 1, wherein the encapsulation layer comprises:
a first encapsulation inorganic layer disposed on the display element layer;
a first encapsulation organic layer disposed on the first encapsulation inorganic layer; and
a second encapsulation inorganic layer disposed on the first encapsulation organic layer,
wherein the color filter layer is disposed between the first encapsulation inorganic layer and the first encapsulation organic layer.

10. The display apparatus of claim 9, wherein the color filter contacts the first encapsulation organic layer.

11. The display apparatus of claim 1, wherein:
the circuit element layer includes an emission area definition layer that is configured to define the emission area; and
the color shielding layer overlaps the emission area definition layer.

12. A display apparatus comprising:
a base layer comprising an emission area and a non-emission area adjacent to the emission area;
a circuit element layer disposed on the base layer;
a display element layer disposed on the circuit element layer, the display element layer including an organic light emitting diode;
an encapsulation layer disposed on the display element layer and configured to encapsulate the organic light emitting diode; and
a color filter layer disposed between the display element layer and the encapsulation layer and in direct contact with a bottommost layer of the encapsulation layer,
wherein the color filter layer includes a color shielding layer having at, least two layers disposed in the non-emission area and a color filter disposed in the emission area.

13. The display apparatus of claim 12, wherein the encapsulation layer comprises:
a first encapsulation inorganic layer disposed on the display element layer;
a first encapsulation organic layer disposed on the first encapsulation inorganic layer; and
a second encapsulation inorganic layer disposed on the first encapsulation organic layer.

14. The display apparatus of claim 13, further comprising:
an auxiliary shielding layer disposed in the non-emission area and disposed on a third color shielding layer,
wherein the auxiliary shielding layer contacts the first encapsulation inorganic layer.

15. A display apparatus comprising:
a base layer comprising an emission area and a non-emission area adjacent to the emission area;
a circuit element layer disposed on the base layer;
a display element layer disposed on the circuit element layer and comprising an organic light emitting diode disposed in the emission area;
an encapsulation layer disposed on the display element layer and configured to encapsulate the organic light emitting diode; and
a color filter layer disposed in the encapsulation layer and in direct contact with a bottom layer of the et capsulation layer,
wherein the color filter layer includes:
a color shielding layer having a plurality of layers disposed in the non-emission area;
a color filter disposed in the emission area; and
art auxiliary shielding layer disposed in the non-emission area and configured to cover the color shielding layer.

16. The display apparatus of claim 15, wherein the encapsulation layer comprises:
a first encapsulation inorganic layer disposed on the display element layer;
a first encapsulation organic layer disposed on the first encapsulation inorganic layer; and
a second encapsulation inorganic layer disposed on the first encapsulation organic layer,
wherein the color filter layer is disposed between the first encapsulation inorganic layer and the first encapsulation organic layer.

17. The display apparatus of claim 16, wherein the auxiliary shielding layer contacts the first encapsulation organic layer.

18. The display apparatus of claim 16, wherein the color shielding layer comprises:
a first color shielding layer having a first color;
a second color shielding layer disposed on the first color shielding layer and having a second color that is different from the first color; and
a third color shielding layer disposed on the second color shielding layer and having a third color that is different from the first and second colors,
wherein a color of the color filter is one of the first to third colors.

19. The display apparatus of claim 16, wherein the auxiliary shielding layer comprises a metal oxide or a metal ally oxide.

20. The display apparatus of claim 16, wherein the auxiliary shielding layer comprises at least one of CuO, CrO, FeO, $Ni_2O_3$, and $MoTaO_x$.

* * * * *